(12) United States Patent
Huang et al.

(10) Patent No.: US 9,310,573 B2
(45) Date of Patent: Apr. 12, 2016

(54) SYSTEM FOR IDENTIFYING CONNECTION BETWEEN DEVICES

(71) Applicant: ACCTON TECHNOLOGY CORPORATION, Hsinchu (TW)

(72) Inventors: Jian-Dau Huang, Taoyuan County (TW); Sheng-Tang Fan, Hsinchu County (TW); Lin-Chin Wu, Hsinchu County (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 77 days.

(21) Appl. No.: 14/195,278

(22) Filed: Mar. 3, 2014

(65) Prior Publication Data

US 2015/0185072 A1 Jul. 2, 2015

(30) Foreign Application Priority Data

Dec. 27, 2013 (TW) .............................. 102224637 U

(51) Int. Cl.
*H01R 13/641* (2006.01)
*G02B 6/42* (2006.01)

(52) U.S. Cl.
CPC .................................. *G02B 6/4292* (2013.01)

(58) Field of Classification Search
CPC ...... G02B 6/3831; G02B 6/3873; G02B 6/26; G02B 6/40; G02B 6/3895; G02B 6/241; H01R 13/641; H01R 13/6691; H01R 13/703; H01R 13/717
USPC ............ 250/221, 214.1, 551, 227.21, 227.22; 385/8, 9, 12, 13
See application file for complete search history.

(56) References Cited

U.S. PATENT DOCUMENTS 4,362,360 A * 12/1982 Mannschke ...................... 385/88
5,324,932 A * 6/1994 Niewisch ................. 250/227.21

\* cited by examiner

*Primary Examiner* — Que T Le
(74) *Attorney, Agent, or Firm* — Ming Chow; Sinorica, LLC

(57) ABSTRACT

An identifying system includes a master device having a lighting member for emitting light and an optical sensor for sensing light, and a slave device having a light guiding member with a light entering portion and a light sensing portion. The light entering portion receives the light from the lighting member, and the light sensing portion is located in a working range of the optical sensor. When the slave device is connected to the master device, the light of the lighting member enters the light guiding member via the light entering portion, and is guided to the light sensing portion.

6 Claims, 5 Drawing Sheets

SYSTEM FOR IDENTIFYING CONNECTION BETWEEN DEVICES

The current application claims a foreign priority to the patent application of Taiwan No. 102224637 filed on Dec. 27, 2013.

BACKGROUND OF THE INVENTION

1. Technical Field

The present invention relates to a detecting system, and more particularly to a detecting system, which examines connection between devices through optical solutions.

2. Description of Related Art

Typically, a main machine (called master device hereafter) of an electronic system is usually accompanying with a lot of electronic units (called slave devices hereafter). The electronic system may need an engineer to manually input some setting information into the master device to control these slave devices.

Take a network server for example, great heat is delivering while the network server operates and needs to be dissipated, otherwise the network server might crash or even cause accidents. Therefore, several fan amounts are standard equipment of the network server for heat dissipation. A processor would be provided to coordinate the fan amounts to exhaust hot air out and/or drain cold air in according to the thermal condition inside the network server to keep the network server operating in a normal condition.

Generally, each fan can be driven to rotate in opposite directions to exhaust hot air out or drain cold air in. Therefore, by controlling the direction of rotation of each fan, the processor could generate a specific air flow inside the network server for heat dissipation.

If the engineer does not install these fans in a correct direction, or the engineer fails to input the correct setting information, the fans might not generate the requested air flow under control of the processor, and may usually cause the network server to be crash because of overheating. Furthermore, it sometimes even causes the network server's damage.

An improved fan is provided in the market which can be mounted bidirectional to avoid the problem. However, such fans are very expensive. If there is an easy and cheap way to overcome the aforementioned problem, it will be a great help to this industry.

BRIEF SUMMARY OF THE INVENTION

In view of the above, the primary objective of the present invention is to provide an identifying system, which detects a connection between the slave devices and the master device to avoid an incorrect connection and incorrect setting.

In order to achieve the objective of the present invention, an identifying system for examining whether a device is in a correct connection includes a master device having a lighting member for emitting light and an optical sensor for sensing light, and a slave device having a light guiding member with a light entering portion and a light sensing portion. The light entering portion receives the light from the lighting member, and the light sensing portion is located within a working range of the optical sensor; and when the slave device is connected to the master device, light of the lighting member enters the light guiding member via the light entering portion, and is guided to the light sensing portion.

With such design, the present invention may examine whether the slave device is connected correctly by determining the sense result of the optical sensor to avoid problems such as incorrect connection of the slave device, or incorrect settings.

DETAILED DESCRIPTION OF THE INVENTION

The detailed description and technical contents of the present invention will be explained with reference to the accompanying drawings. However, the drawings are for illustration only and cannot be used to limit the present invention.

Figure 1:
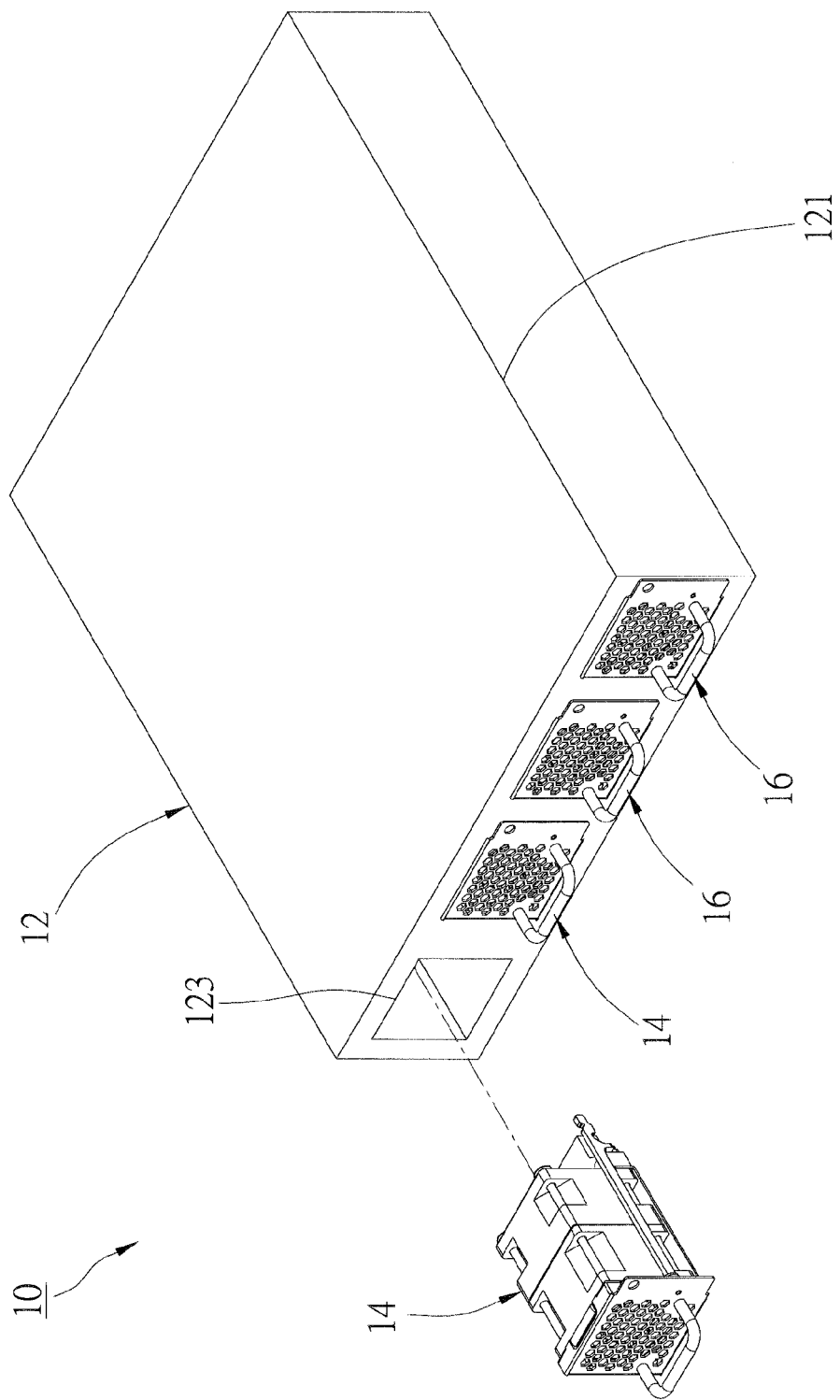
FIG. 1 is a perspective view of a preferred embodiment of the present invention.
Figure 2:
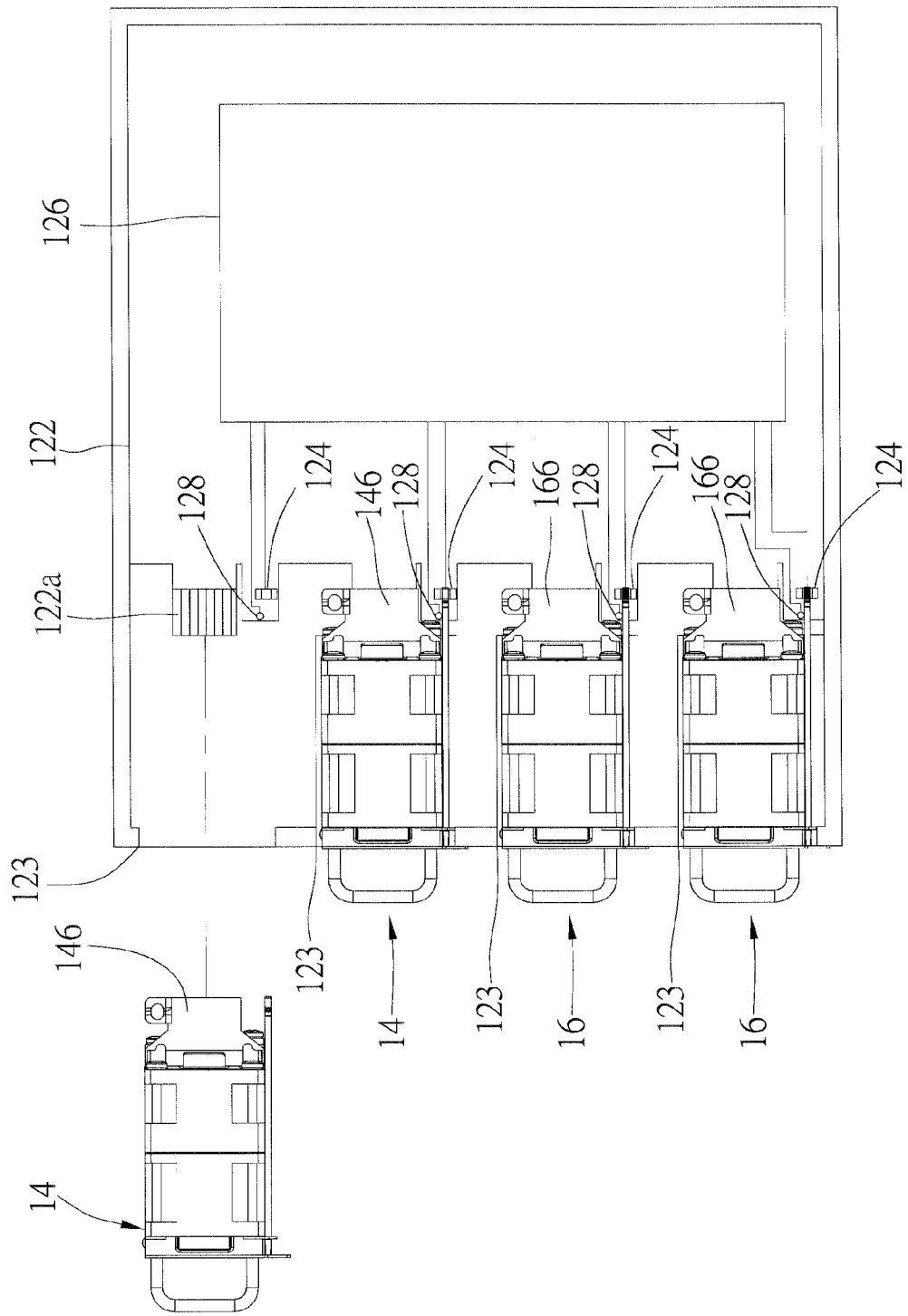
FIG. 2 is a top view of the preferred embodiment of the present invention.

As shown in FIG. 1 and FIG. 2, an identifying system 10 of the preferred embodiment of the present invention includes a master device 12, a plurality of first slave devices 14, and a plurality of second slave devices 16.

In an embodiment, the master device 12 is a network server, having a case 121, in which a substrate 122, a processor 126, a plurality of optical sensors 124, and a plurality of lighting members 128 are received. The case 121 has several openings 123 on a side thereof. The substrate 122 has several sockets 122a aligned with the openings 123 of the case 121 respectively.

It is noted that except for network server, the master device 12 may be any electronic device, and the first and the second slave devices 14 and 16 may be any electronic device as well. Numbers of the openings 123 and the sockets 122a may increase or decrease based on the numbers of the first and the second slave devices 14 and 16 to be connected.

The processor 126 is provided on the substrate 122 and electrically connected to the sockets 122a respectively to supply or cut off power to the sockets 122a under control. The processor is stored with data of the first and the second slave devices 14 and 16. The optical sensors 124 are provided on the substrate 122 in association with the sockets 122a respectively. In an embodiment, the optical sensors 124 are optical couplers (OC) to generate an electrical signal when it senses an optical signal. The lighting members 128 are provided on the substrate 122 in association with the optical sensors 124 respectively. The processor 126 is electrically connected to the lighting members 128 to turn on or turn off the lighting members 128 under control. In an embodiment, the lighting members 128 may be light bulbs, LEDs (light emitting diodes), or other devices which emit light.

Figure 3:
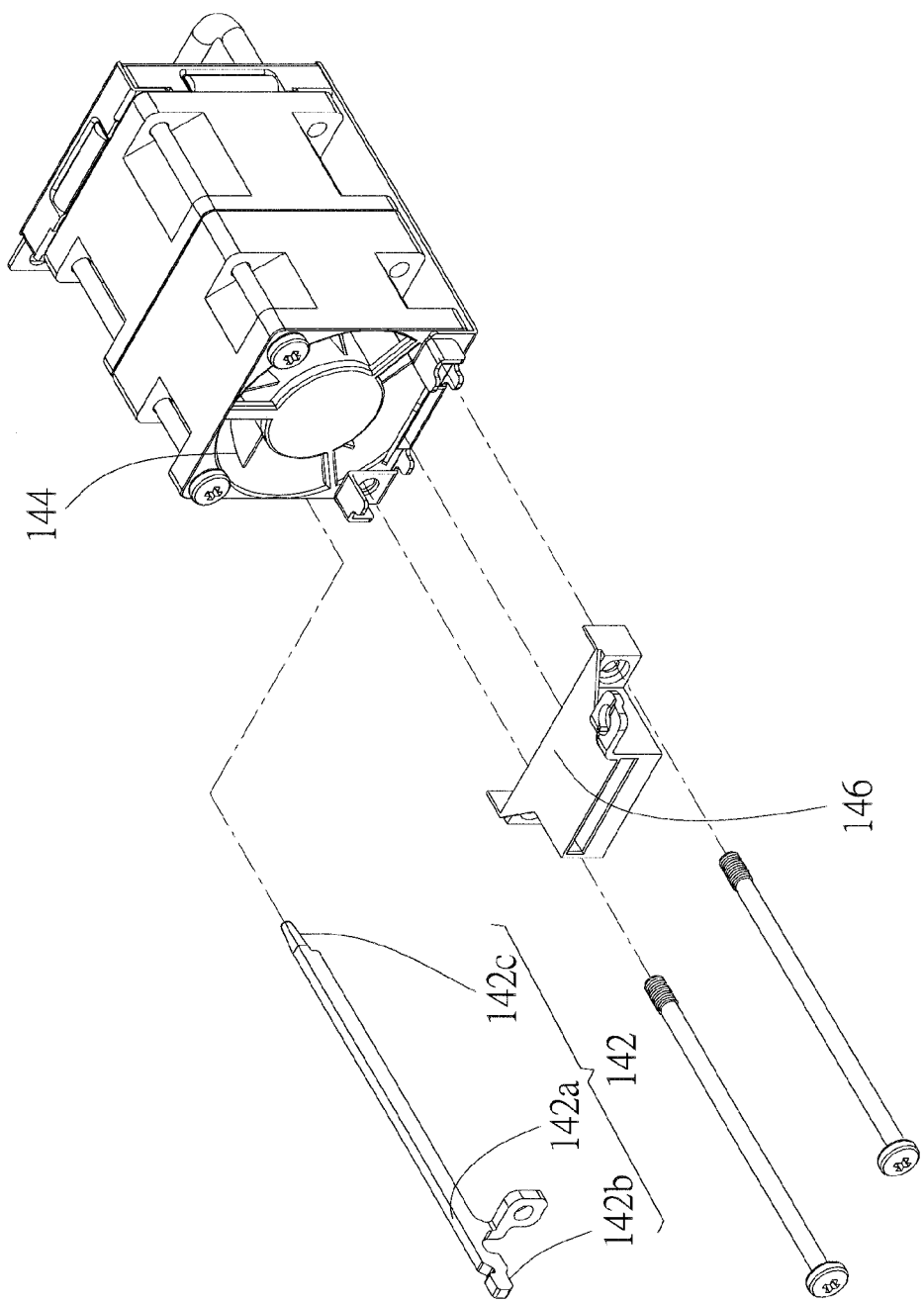
FIG. 3 is an exploded view of the preferred embodiment of the present invention, showing the first slave device.
Figure 4:
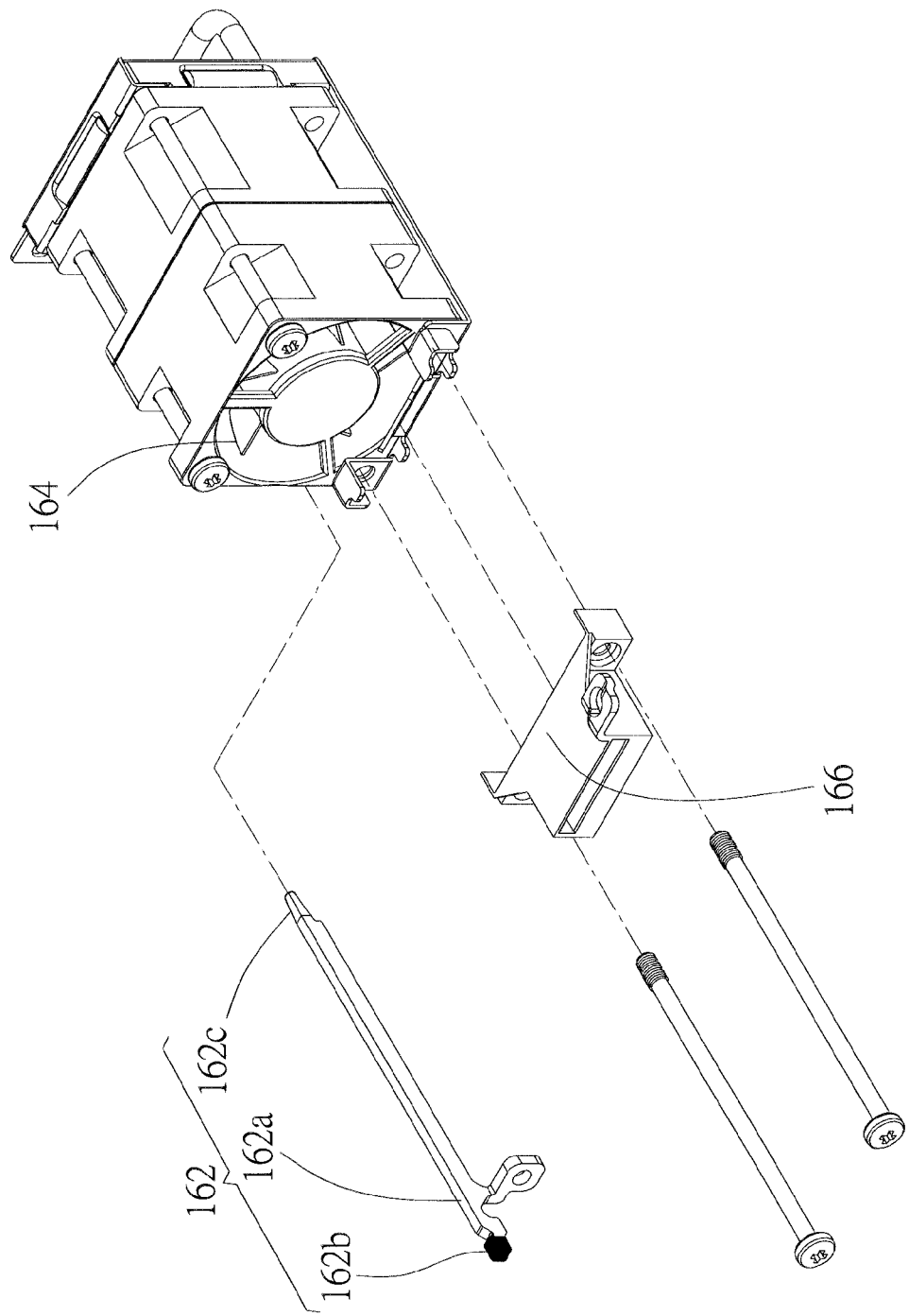
FIG. 4 is an exploded view of the preferred embodiment of the present invention, showing the second slave device.

As shown in FIG. 3 and FIG. 4, each first slave device 14 has a first light guiding member 142 and a first electronic member 144. In an embodiment, the first light guiding member 142 is a light pipe to transmit optical signals. The first light guiding member 142 has a first light entering portion 142a, a first sensing portion 142b, and a first light exiting portion 142c, wherein the first sensing portion 142b and the first light exiting portion 142c are at opposite ends of the first light guiding member 142. It is noted that the first sensing portion 142b is light transmissible, and the first light entering portion 142a is between the first sensing portion 142b and the first light exiting portion 142c. Light enters the first light guiding member 142 via the first light entering portion 142a, and is guided separately to the first sensing portion 142b and the first light exiting portion 142c. In an embodiment, the first electronic member 144 is a fan having a power port 146 to receive power to turn the fan.

As shown in FIG. 4, each second slave device 16 has a second light guiding member 162 and a second electronic member 164. The same as the first slave device 14, the second light guiding member 162 has a second light entering portion 162a, a second sensing portion 162b, and a second light exiting portion 162c. The different part is that the second sensing portion 162b is light-tight. The second electronic member 164 is a fan as well to generate an air flow in a direction which is opposite to that of the first electronic member 144. The second electronic member 164 has a power port 166 also.

Figure 5:
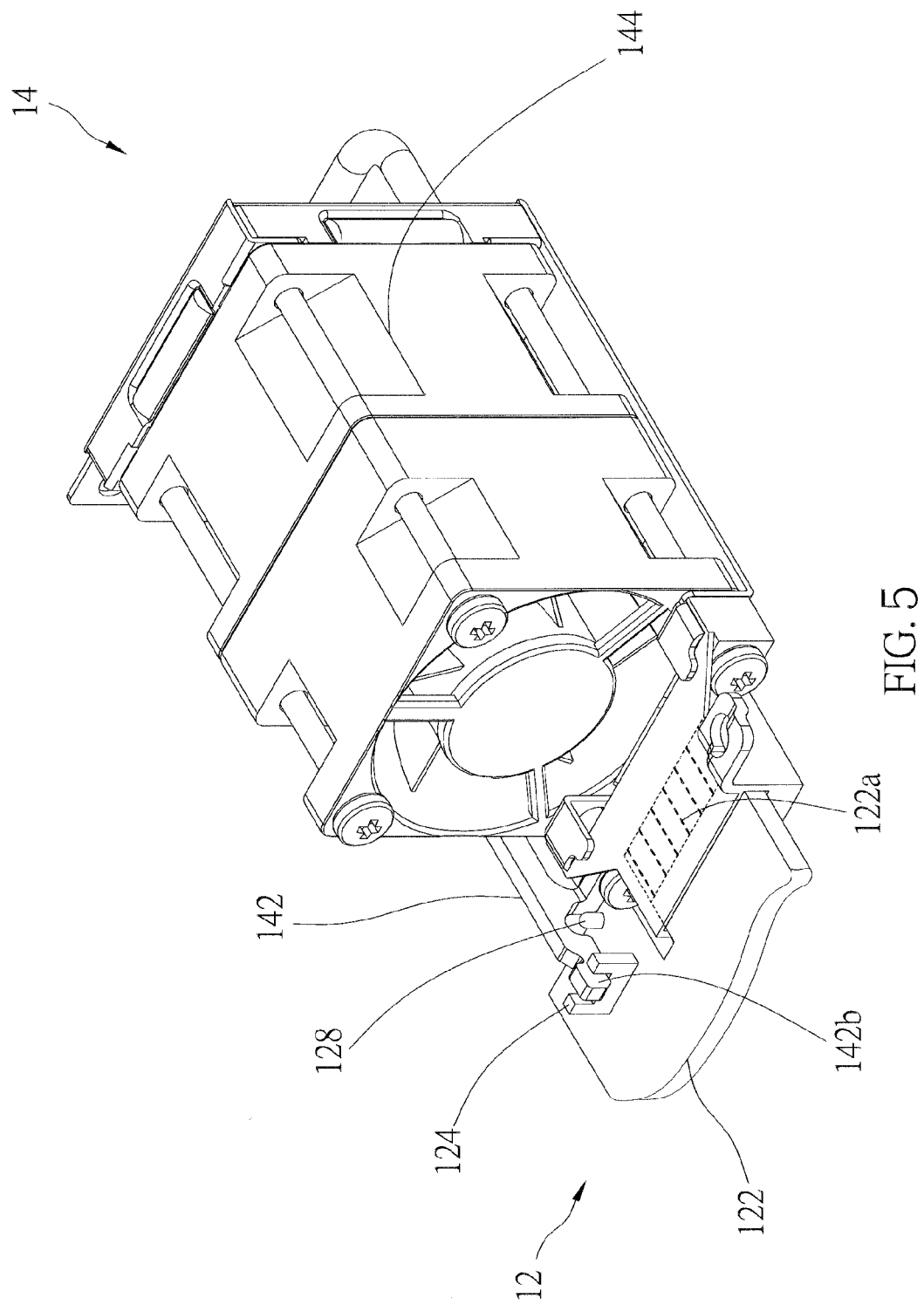
FIG. 5 is a perspective view of the preferred embodiment of the present invention, showing the connection of the first slave device and the substrate.

As shown in FIG. 1 and FIG. 2, when an engineer installs the first slave device 14 into the opening 123 of the case 121 of the master device 12, the power port 146 of the first slave device 14 electrically connects with the corresponding socket 122a to receive power. The corresponding lighting member 128 emits light to the first light entering portion 142a of the first light guiding member 142, and the first sensing portion 142b extends to a working range of the corresponding optical sensor 124 (FIG. 5). As a result, when light emitted by the lighting member 128 enters the first light guiding member 142, it will exit via the transmissible first sensing portion 142b and be sensed by the optical sensor 124, and the optical sensor 12 will generate an electrical signal accordingly.

On the contrary, when an engineer inserts the second slave device 16 into the opening 123 of the case 121 of the master device 12, the power port 166 of the second slave device 16 electrically connects with the corresponding socket 122a to receive power.

The corresponding lighting member 128 emits light to the second light entering portion 162a of the second light guiding member 162, and the second sensing portion 162b extends to a working range of the corresponding optical sensor 124. When light of the lighting member 128 enters the second light guiding member 162, it will not exit via the light-tight second sensing portion 162b, and the optical sensor 124 will not generate the electrical signal because no optical signal is sensed.

As a result, the engineer may acquire that it is the first slave device 14 or the second slave device 16 by the sense result of the optical sensor 124.

In conclusion, the identifying system 10 of the present invention may check which slave device (the first slave device or the second slave device) is connected to socket of the master device to avoid the incorrect connection problem.

Besides, the engineer may check the slave devices installation by visual. The one with a transmissible sensing portion 142b is the first slave device, and the one with a light-tight sensing portion 162b is the second slave device 16. Therefore, the engineer may identify which one is the first slave device 14 and which one is the second slave device 16 before connect it to the master device 12.

After the slave device installed on the master device 12, the engineer may determine whether the slave devices are working normally by visual as well. The slave device with a lighting light exiting portion means that this device works normally, and the slave device with a dark light exiting portion means that this device is abnormal. The sense results of the optical sensors 124 are transmitted to the processor 126, and the processor 126 will examine these results with the data of the slave devices. If they are consistent, it means that the slave devices are in a correct connection. If they are inconsistent, it means that at least one of the slave devices is installed incorrectly, and the processor 126 may activate an alarm to warn the engineer. The multiple checking ways may reduce risk of the incorrect connection of the slave devices.

It is noted that the light guiding members and the optical sensors used in the present invention are very cheap, and they can accurately check that whether the slave devices are installed correctly. In comparison with the prior art, the present invention is cheaper and accurate.

The devices to be identified by the identifying system of the present invention should be not merely limited in the network server and the fans as describe above. Any electronic system which has a chance to be installed incorrectly may use the concept of the present invention.

It must be pointed out that the embodiments described above are only some preferred embodiments of the present invention. All equivalent structures which employ the concepts disclosed in this specification and the appended claims should fall within the scope of the present invention.

What is claimed is:

1. An identifying system comprising:
   a master device having a lighting member for emitting light and an optical sensor, wherein the optical sensor has a working range for sensing light; and
   a slave device having a light guiding member with a light entering portion and a light sensing portion, wherein the light entering portion receives the light from the lighting member; when the slave device is connected to the master device, the light sensing portion is located within the working range of the optical sensor, and light emitted from the lighting member enters the light guiding member via the light entering portion, and is guided to the light sensing portion;
   wherein the optical sensor generates an electrical signal upon sensing light for identifying whether a device is in a correct connection.

2. The identifying system of claim 1, wherein the light sensing portion of the light guiding member is light transmissible.

3. The identifying system of claim 1, wherein the light sensing portion of the light guiding member is light-tight.

4. The identifying system of claim 1, wherein the light guiding member further has a light exiting portion, and the light entering the light guiding member via the light entering portion is guided to the light exiting portion as well.

5. The identifying system of claim 4, wherein the light exiting portion and the light sensing portion are located at opposite ends of the light guiding member respectively.

6. The identifying system of claim 1, wherein the master device is provided with a socket for transmitting electrical signals; the slave device has an electronic member to be electrically connected to the socket to receive the electrical signals.

* * * * *